United States Patent
Tokuda (10) Patent No.: US 9,191,005 B2
(45) Date of Patent: Nov. 17, 2015

(54) LEVEL CONVERSION CIRCUIT AND LEVEL-CONVERSION-FUNCTION-EQUIPPED LOGIC CIRCUIT

(71) Applicant: Murata Manufacturing Co., Ltd., Kyoto (JP)

(72) Inventor: Masamichi Tokuda, Kyoto (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 0 days.

(21) Appl. No.: 14/330,090

(22) Filed: Jul. 14, 2014

(65) Prior Publication Data
US 2014/0320167 A1    Oct. 30, 2014

Related U.S. Application Data

(63) Continuation of application No. PCT/JP2013/050158, filed on Jan. 9, 2013.

(30) Foreign Application Priority Data

Feb. 7, 2012  (JP) .................................. 2012-024202

(51) Int. Cl.
*H03K 19/0175* (2006.01)
*H03K 19/0185* (2006.01)

(52) U.S. Cl.
CPC .................. *H03K 19/017509* (2013.01); *H03K 19/018507* (2013.01)

(58) Field of Classification Search
CPC .................... H03K 19/075; H03K 19/017509; H03K 19/0185; H03K 19/018505; H01L 27/06
USPC ........... 326/62, 63, 68, 73, 80–83, 86, 89, 90; 315/209 R, 210, 224, 225, 291
See application file for complete search history.

(56) References Cited

U.S. PATENT DOCUMENTS

| 4,760,288 A |   | 7/1988 | Peczalski |
| 5,323,071 A | * | 6/1994 | Hirayama ........................ 326/68 |

FOREIGN PATENT DOCUMENTS

| EP | 312630 A1 | 4/1989 |
| JP | 62-032640 A | 2/1987 |
| JP | 2001-024500 A | 1/2001 |
| JP | 2009-033637 A | 2/2009 |

OTHER PUBLICATIONS

International Search Report issued in Application No. PCT/JP2013/050158 dated Apr. 2, 2013.
Written Opinion issued in Application No. PCT/JP2013/050158 dated Apr. 2, 2013.

* cited by examiner

*Primary Examiner* — Jimmy Vu
(74) *Attorney, Agent, or Firm* — Pearne & Gordon LLP (57) ABSTRACT

A level conversion circuit (10) includes an EFET (11), a diode (12) and resistors (13, 14). The drain of the EFET (11) is connected to an output terminal of the level conversion circuit (10). The drain and the gate of the EFET (11) are in conductive contact with each other. The source of the EFET (11) is grounded via the resistor (13). The drain of the EFET (11) is connected to one end of the resistor (14). The other end of the resistor (14) is connected to the cathode of the diode (12). The anode of the diode (12) is connected to a control voltage input terminal.

14 Claims, 6 Drawing Sheets

PRIOR ART

FIG. 7

PRIOR ART

PRIOR ART

LEVEL CONVERSION CIRCUIT AND LEVEL-CONVERSION-FUNCTION-EQUIPPED LOGIC CIRCUIT

BACKGROUND OF THE INVENTION

1. Field of the Invention

The present invention relates to a level conversion circuit that converts a voltage level and to a level-conversion-function-equipped logic circuit.

2. Description of the Related Art

When a logic circuit such as an inverter is formed using a semiconductor, generally a common-source amplifier circuit such as a direct coupled FET logic (DCFL) circuit is used. If the gate voltage rises in an MESFET or JFET, in which the gate is a diode, as an example of a source-grounded FET, a current will suddenly flow through the FET and there is a possibility that the FET will break down.

Consequently, to date, a variety of technologies for inserting a level conversion circuit into the stage before a logic circuit and ensuring that an excessive voltage is not applied to an FET of the logic circuit have been devised such as a level conversion circuit described in Patent Document 1, for example.

Figure 6:
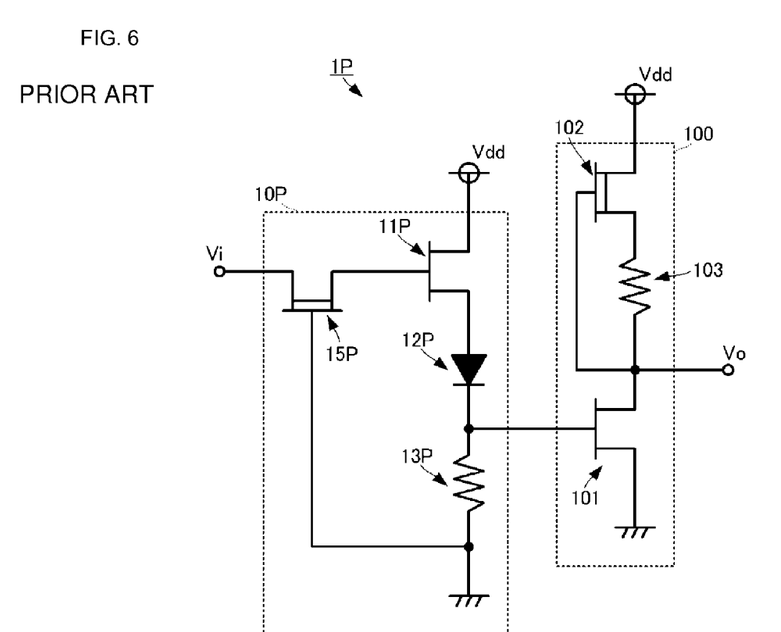
FIG. 6 is a circuit diagram of a level-conversion-function-equipped logic circuit 1P including a level conversion circuit described in Patent Document 1.

FIG. 6 is a circuit diagram of a level-conversion-function-equipped logic circuit 1P including the level conversion circuit described in Patent Document 1. The level-conversion-function-equipped logic circuit 1P includes a level conversion circuit 10P and a logic circuit 100.

The logic circuit 100 includes an EFET 101, a DFET 102 and a resistor 103. The EFET 101 is an enhancement type FET and its source is grounded. The gate of the EFET 101 serves as an input terminal of the logic circuit 100. The drain of the EFET 101 is connected to an output terminal (output voltage Vo) and is connected to the source of the DFET 102 via the resistor 103. The DFET 102 is a depletion type FET and its drain is connected to a voltage application terminal (driving voltage Vdd). The gate of the DFET 102 is connected to the drain of the EFET 101 and the output terminal.

The level conversion circuit 10P includes an EFET 11P, a diode 12P, a resistor 13P and a DFET 15P. The EFET 11P is an enhancement type FET and its drain is connected to a driving voltage application terminal (driving voltage Vdd). The anode of the diode 12P is connected to the source of the EFET 11P. The cathode of the diode 12P is connected to the ground via the resistor 13P. A connection point between the diode 12P and the resistor 13P serves as an output terminal of the level conversion circuit 10P and is connected to the input terminal of the logic circuit 100.

The DFET 15P is a depletion type FET and its drain is connected to an input terminal (input voltage Vi). The source of the DFET 15P is connected to the gate of the EFET 11P. The gate of the DFET 15P is grounded. Even if the DFET 15P is omitted, a level conversion circuit having the same function can be realized by using for example a circuit configuration in which a resistor is connected in series between the diode 12P and the output terminal.

Patent Document 1: Japanese Unexamined Patent Application Publication No. 2009-33637

BRIEF SUMMARY OF THE INVENTION

However, in the level-conversion-function-equipped logic circuit 1P equipped with the level conversion circuit 10P illustrated in FIG. 6, the following problems occur. The DFET 15P is provided in order to prevent an excessive current flowing to the gate of the EFET 11P leading to the breakdown of the EFET 11P, and therefore firstly a description will be given of a problem that would occur in a level conversion circuit of the related art having a circuit configuration obtained by omitting the DFET 15P and connecting a resistor 15P' as described above.

Figure 7:
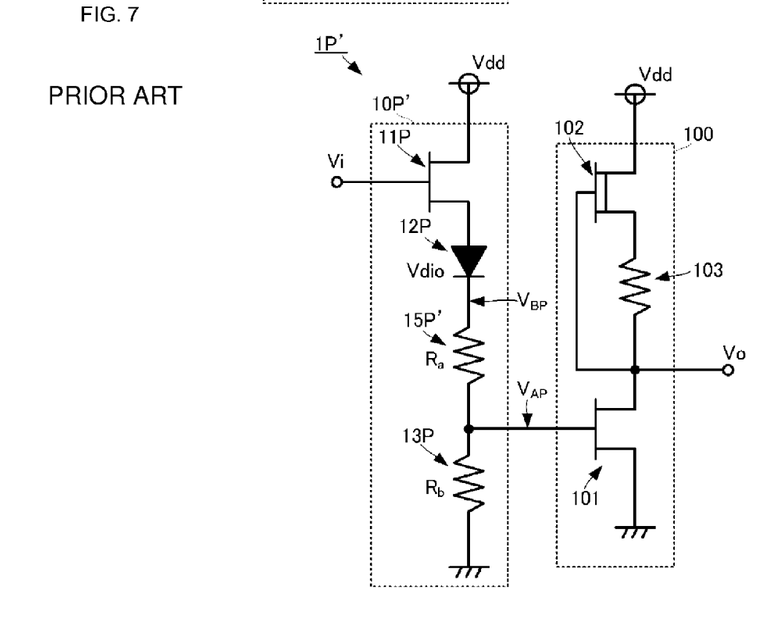
FIG. 7 is an equivalent circuit diagram of a level-conversion-function-equipped logic circuit 1P' including a level conversion circuit 10P' having the same function, which is obtained by replacing the DFET 15P with a resistor 15P'.

FIG. 7 is an equivalent circuit diagram of a level-conversion-function-equipped logic circuit 1P' including a level conversion circuit 10P' having the same function, which is obtained by replacing the DFET 15P with the resistor 15P'. In FIG. 7, $V_{AP}$ indicates (an input voltage of the logic circuit 100) and an output voltage of the level conversion circuit 10P'. Vi indicates an input voltage of the level conversion circuit 10P'. $V_{BP}$ indicates a cathode side voltage of the diode and Vdio is a forward voltage of the diode.

In this circuit configuration, if a pinch off voltage of the EFET 11P is Vpe(LS), the cathode side voltage $V_{BP}$ of the diode 12P can be expressed as follows.

[Expression 1]

$$V_{BP} = Vi - Vpe(LS) - Vdio \qquad (1)$$

The output voltage $V_{AP}$ can be expressed with the following expression.

[Expression 2]

$$V_{AP} = \left(\frac{R_b}{R_a + R_b}\right) V_{BP} - \qquad (2)$$

Here, if setting is performed to invert the logic of the logic circuit 100 with $V_{AP}$=Vpe(IN)+α, the following expression is obtained from Expressions (1) and (2). Here, Vpe(IN)+α is a voltage at which (Vdd-Vo impedance)>(drain-source impedance of EFET 101).

[Expression 3]

$$Vpe(\text{IN}) + \alpha = \left(\frac{R_b}{R_a + R_b}\right)(Vi - Vpe(LS) - Vdio) - \qquad (3)$$

Here, in the case where the EFET 11P and the EFET 101 are formed at positions close to each other on the same semiconductor substrate, setting can be performed such that the pinch off voltages have the same values and the same characteristics. Therefore, Vpe(LS)=Vpe(IN)=Vpe can be set and the input voltage Vi can be expressed with the following expression from Expression (3).

[Expression 4]

$$Vi = \left(\left(\frac{R_a}{R_b}\right) + 2\right) Vpe + \left(\left(\frac{R_a}{R_b}\right) + 1\right)\alpha + Vdio - \qquad (4)$$

Here, $(R_a/R_b)$ is a positive value.

Therefore, as is clear from Expression (4), the input voltage Vi has a variation at least twice as much as that of the pinch off voltage Vpe(LS).

Thus, as illustrated in FIG. 7, the input voltage Vi, which determines the switching operation of the logic circuit 100, is affected by variations in the pinch off voltages Vpe of the EFET 11P and the EFET 101 and varies greatly so that it does not satisfy certain specifications.

Figure 8:
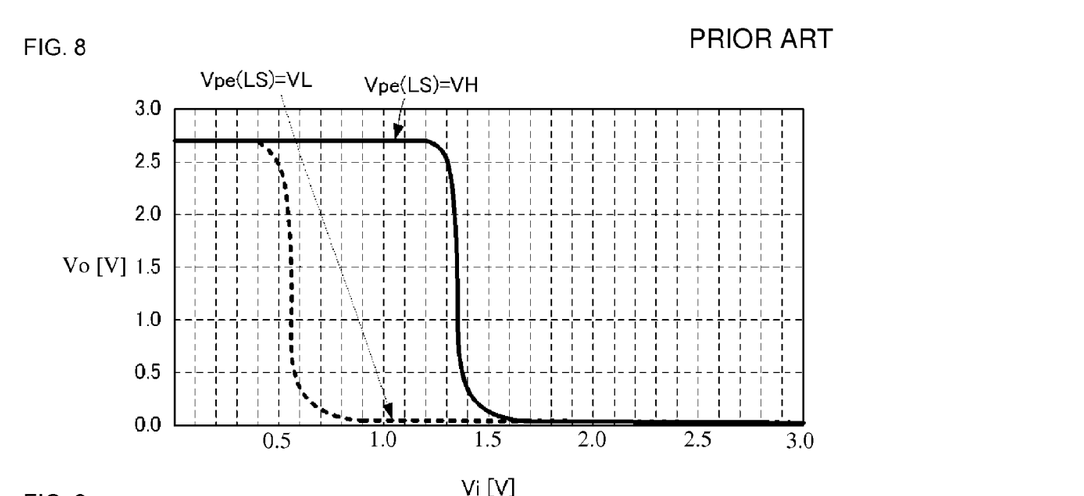
FIG. 8 illustrates the simulation results for a Vi-Vo characteristic that illustrates the effect of variations in a pinch off voltage Vpe(LS) of an EFET 11P on an output voltage Vo of a logic circuit 100.

FIG. 8 illustrates the simulation results for a Vi-Vo characteristic that illustrates the effect of variations in the pinch off voltage Vpe(LS) of the EFET 11P on the output voltage Vo of the logic circuit 100. In FIG. 8, the solid line represents a case in which the pinch off voltage Vpe(LS) is a high voltage VH. The broken line represents a case in which the pinch off voltage Vpe(LS) is a low voltage VL.

As illustrated in FIG. 8, the switching voltage Vch is very different in the case where the pinch off voltage Vpe(LS) is the low voltage VL (for example, 0.1 V) and in the case where the pinch off voltage Vpe(LS) is the high voltage VH (for example, 0.4 V). For example, the difference is around 0.8 V in the example illustrated in FIG. 8.

In addition, in the level conversion circuit 10P, which includes the DFET 15P, the following problem additionally occurs.

Figure 9:
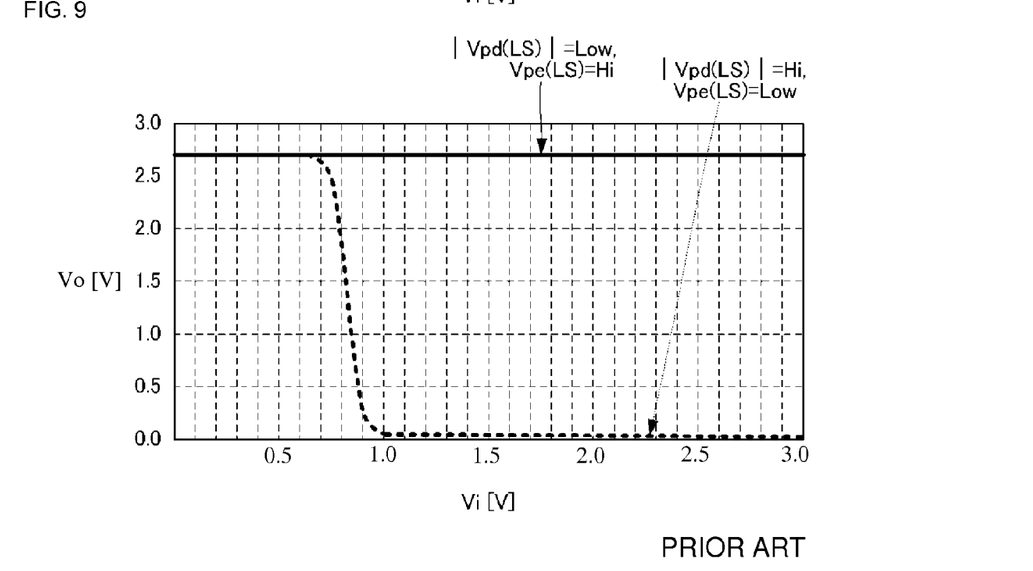
FIG. 9 illustrates the simulation results for a Vi-Vo characteristic that illustrates the effect of variations in a pinch off voltage Vpe(LS) of an EFET 11P and variations in a pinch off voltage Vpd(LS) of an DFET 15P on the output voltage Vo of the logic circuit 100.

FIG. 9 illustrates the simulation results for a Vi-Vo characteristic that illustrates the effect of variations in the pinch off voltage Vpe(LS) of the EFET 11P and variations in the pinch off voltage Vpd(LS) of the DFET 15P on the output voltage Vo of the logic circuit 100. In FIG. 9, the solid line represents a case where the pinch off voltage Vpe(LS) is a high voltage VH and the absolute value of the pinch off voltage Vpd(LS) is a low voltage VL'. The broken line illustrates a case where the pinch off voltage Vpe(LS) is a low voltage VL (for example, 0.1 V) and the absolute value of the pinch off voltage Vpd(LS) is a high voltage VH' (for example, −1.0 V).

As illustrated in FIG. 9, in the case where the pinch off voltage Vpe(LS) is the low voltage VL (for example, 0.1 V) and the absolute value of the pinch off voltage Vpd(LS) is the high voltage VH' (for example, −1.0 V), the logic circuit 100 operates normally. However, in the case where the pinch off voltage Vpe(LS) is a high voltage VH (for example, 0.4 V) and the absolute value of the pinch off voltage Vpd(LS) is a low voltage VL' (for example, −0.7 V), the logic circuit 100 does not operate. This is because the output voltage from the DFET 15P does not reach the pinch off voltage Vpe(LS) of the EFET 11P and therefore the output voltage $V_A$ of the level conversion circuit 10P does not reach the pinch off voltage of the EFET 101.

Thus, in the level-conversion-function-equipped logic circuit 1P of the related art, the switching voltage Vch of the logic circuit 100 varies greatly depending on the pinch off voltages of the constituent FETs and sometimes the switching operation is not performed.

Therefore, an object of the present invention is to provide a level conversion circuit and a level-conversion-circuit-equipped logic circuit that suppress the effect of variations in the pinch off voltage of a constituent FET and that reduce variations in a switching voltage Vch.

The present invention relates to a level conversion circuit that is connected upstream of a logic circuit, an input FET of the logic circuit being an enhancement type FET, and is characterized as follows. The level conversion circuit includes a first enhancement type FET whose drain and gate are connected to a gate of the input FET, a first resistor, which is for voltage maintenance, that is connected between a source of the first enhancement type FET and ground, and voltage shifting means and current restriction means that are connected in series between the drain and the gate of the first enhancement type FET and a control voltage input terminal.

With this configuration, variations in the level conversion circuit do not depend on variations in a pinch off voltage of the first enhancement type FET. Therefore, an output voltage (output voltage of level conversion circuit) having stable characteristics with respect to a control input voltage can be supplied to the input FET of the logic circuit.

In addition, it is preferable that the voltage shifting means of the level conversion circuit of the present invention be a diode. With this configuration, a concrete example of the voltage shifting means is illustrated.

In addition, the current restriction means of the level conversion circuit of the present invention may include a second resistor.

In addition, the current restriction means of the level conversion circuit of the present invention may include a depletion type FET.

With these configurations, specific examples of a configuration of the current restriction means are illustrated. In particular, if a depletion type FET is used, the current restriction means can be made small.

A logic circuit of the present invention includes a level conversion circuit described above, a logic-circuit-side depletion type FET in which a driving voltage is applied to its drain, and logic-circuit-side voltage maintenance means that is connected to a source of the logic-circuit-side depletion type FET. A source of the enhancement type FET, which is the input FET, is grounded, a drain of the enhancement type FET, which is the input FET, is connected to a source of the logic-circuit-side depletion type FET via the logic-circuit-side voltage maintenance means, and a connection point between the drain of the enhancement type FET, which is the input FET, and the logic-circuit-side voltage maintenance means serves as an output terminal and is connected to a gate of the depletion type FET.

With this configuration, a level conversion circuit output voltage having stable characteristics with respect to the control input voltage is supplied to the input FET from the above-described level conversion circuit and therefore variations in a switching voltage of the logic circuit with respect to the control input voltage are suppressed. Thus, a level-conversion-function-equipped logic circuit that operates stably with few individual differences with respect to a control input voltage can be realized.

In addition, it is preferable that the input FET of the logic circuit and the first enhancement FET of the level conversion circuit of the present invention be formed on the same semiconductor substrate.

With this configuration, preferred forms of the input FET of the logic circuit and the first enhancement FET of the level conversion circuit are illustrated. With this configuration, variations in the switching voltage Vch of the logic circuit can be reduced with more certainty.

In addition, the logic-circuit-side voltage maintenance means of the logic circuit of the present invention can also be formed of a diode.

With this configuration, the logic-circuit-side voltage maintenance means can be made small.

With the present invention, the effect of the pinch off voltage of constituent FETs can be suppressed and variations in the switching voltage Vch of the logic circuit can be reduced.

DETAILED DESCRIPTION OF THE INVENTION

Figure 1:
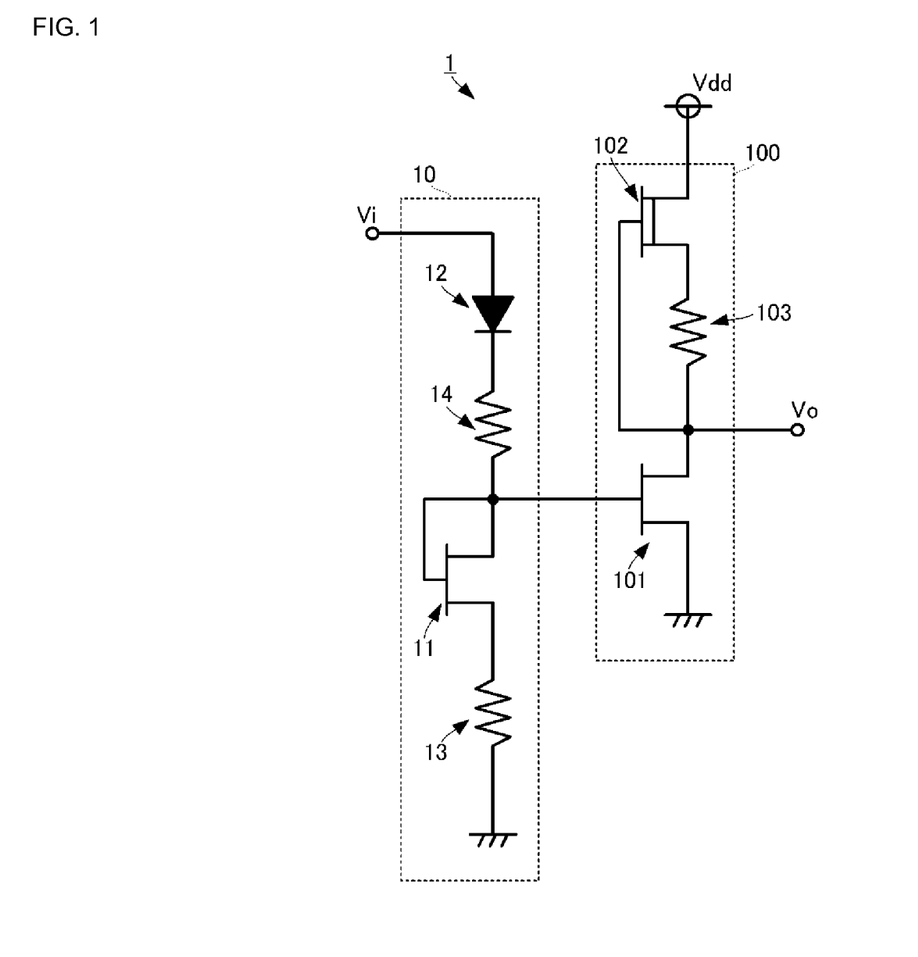
FIG. 1 is a circuit diagram of a level-conversion-function-equipped logic circuit 1 according to a first embodiment.

A level conversion circuit and a level-conversion-function-equipped logic circuit according to a first embodiment of the present invention will be described with reference to the drawings. FIG. 1 is a circuit diagram of a level-conversion-function-equipped logic circuit 1 according to the first embodiment.

The level-conversion-function-equipped logic circuit 1 is formed with a semiconductor substrate such as a GaAs substrate and includes a level conversion circuit 10 and a logic circuit 100.

The logic circuit 100 includes an EFET 101, a DFET 102 and a resistor 103.

The EFET 101 is an enhancement type FET and corresponds to an "input FET" of the present invention. The source of the EFET 101 is grounded. The gate of the EFET 101 serves as an input terminal of the logic circuit 100. The EFET 101 is formed of a MESFET or a JFET in which the gate is a diode.

The drain of the EFET 101 is connected to an output terminal (output voltage Vo) and is connected to one end of the resistor 103. The resistor 103 corresponds to "logic-circuit-side voltage maintenance means" of the present invention. A resistance of the resistor 103 is appropriately set in accordance with a desired output voltage Vo.

The DFET 102 is a depletion type FET and corresponds to a "logic-circuit-side depletion type FET" of the present invention. The DFET 102 is also formed of a MESFET or a JFET. The drain of the DFET 102 is connected to a driving voltage application terminal (driving voltage Vdd). The driving voltage Vdd (for example, 2.7 V) of the logic circuit 100 is supplied from this driving voltage application terminal.

The gate of the DFET 102 is connected to the drain of the EFET 101 and the output terminal of the logic circuit 100. The source of the DFET 102 is connected to the other end of the resistor 103.

The logic circuit 100 having the above-described circuit configuration operates as follows in accordance with a logic circuit input voltage (level conversion circuit output voltage $V_A$).

A hi/low switching operation of the logic circuit 100 is determined by the logic circuit input voltage (level conversion circuit output voltage $V_A$) and a pinch off voltage of the EFET 101. That is, in a state in which the logic circuit input voltage (level conversion circuit output voltage $V_A$) is lower than a pinch off voltage Vpe(IN)+α in the EFET 101, the output voltage Vo of the logic circuit 100 enters a hi state, and in a state in which the logic circuit input voltage (level conversion circuit output voltage $V_A$) is equal to or greater than the pinch off voltage Vpe(IN)+α in the EFET 101, the output voltage Vo of the logic circuit 100 enters a low state. Here, Vpe(IN)+α is a voltage at which (Vdd-Vo impedance)> (drain-source impedance of EFET 101).

The level conversion circuit 10 is connected upstream of the logic circuit 100. More specifically, its configuration is as follows.

The level conversion circuit 10 includes an EFET 11, a diode 12 and resistors 13 and 14.

The EFET 11 is an enhancement type FET and corresponds to a "first enhancement type FET" of the present invention. The EFET 11 is also formed of a MESFET or a JFET, in which the gate is a diode. In addition, the EFET 11 is formed on the same semiconductor substrate as the EFET 101 of the logic circuit 100. In addition, when the EFET 11 and the EFET 101 of the logic circuit 100 are formed on the same semiconductor substrate, they have similar pinch off voltages and characteristics. Furthermore, if the EFET 11 and the EFET 101 of the logic circuit 100 are formed so as to be adjacent or close to each other, they have even more similar pinch off voltages and characteristics.

The drain of the EFET 11 is connected to an output terminal of the level conversion circuit 10. In other words, the drain of the EFET 11 is connected to the gate of the EFET 101 of the logic circuit 100. The drain and the gate of the EFET 11 are directly connected to each other (in conductive contact with each other).

The source of the EFET 11 is grounded via the resistor 13.

The resistor 13 corresponds to a "first resistor" of the present invention. When the EFET 11 is in an on state, the resistor 13 functions as a resistor for maintaining a voltage of the output terminal of the level conversion circuit 10 at a predetermined voltage.

One end of the resistor 14 is connected to the drain and the gate of the EFET 11. The resistor 14 corresponds to "current restriction means" of the present invention. As a result of providing the resistor 14, when the EFET 101 of the logic circuit 100 is in an on state and an input voltage Vi rises, a current flowing to the gate of the EFET 101 can be restricted. The resistor 14 corresponds to a "second resistor" of the present invention.

A cathode of the diode 12 is connected to the other end of the resistor 14. The diode 12 corresponds to "voltage shifting means" of the present invention. The anode of the diode 12 is connected to a control voltage input terminal (input voltage Vi).

Figure 2:
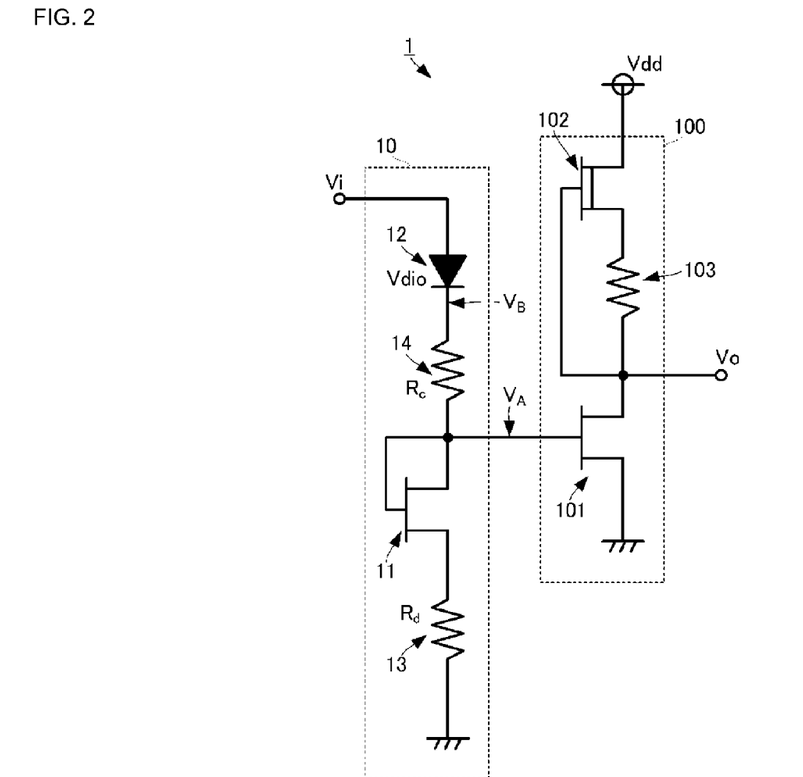
FIG. 2 is an equivalent circuit diagram of a level conversion circuit 10 according to the first embodiment.

The thus-configured level conversion circuit 10 operates as follows. FIG. 2 is an equivalent circuit diagram of the level conversion circuit 10 according to the first embodiment.

In FIG. 2, $V_A$ indicates (an input voltage of the logic circuit 100) and an output voltage of the level conversion circuit 10. Vi indicates an input voltage of the level conversion circuit 10. $V_B$ is a cathode side voltage of the diode and Vdio is a forward voltage of the diode.

In this circuit configuration, if a pinch off voltage of the EFET 11 is Vpe(LS), the cathode side voltage $V_B$ of the diode 12 can be expressed as follows.

[Expression 5]

$$V_B = Vi - Vdio \qquad (5)$$

The output voltage $V_A$ can be expressed with the following expression.

[Expression 6]

$$V_A = Vpe(LS) + \left(\frac{R_d}{R_c + R_d}\right)(V_B - Vpe(LS)) - \quad (6)$$

Here, if setting is performed so that the logic of the logic circuit 100 is inverted using $V_A=Vpe(IN)+\alpha$, the following expression is obtained from Expressions (5) and (6).

[Expression 7]

$$Vpe(IN) + \alpha = Vpe(LS) + \left(\frac{R_d}{R_c + R_d}\right)(Vi - Vpe(LS) - Vdio) - \quad (7)$$

Then, as described above, characteristics of the EFET 11 and the EFET 101 including the pinch off voltage are substantially the same and therefore it is possible to make Vpe(IN)=Vpe(LS)=Vpe and from Expression (7) the input voltage Vi can be expressed using the following expression.

[Expression 8]

$$Vi = Vpe + \left(\left(\frac{R_c}{R_d}\right) + 1\right)\alpha + Vdio - \quad (8)$$

Therefore, as is clear from Expression (8), the input voltage Vi only varies to the extent of variations in the pinch off voltage Vpe.

Thus, with the configuration of this embodiment, the effect of individual differences due to a semiconductor substrate or the structure of the EFET 11 can be reduced and a more stable level conversion circuit output voltage $V_A$ can be obtained with respect to the input voltage Vi. Thus, compared with the configuration of the related art, the effect of individual differences of a semiconductor substrate and an EFET can be suppressed and the switching operation of the logic circuit 100 can be stabilized.

Figure 3:
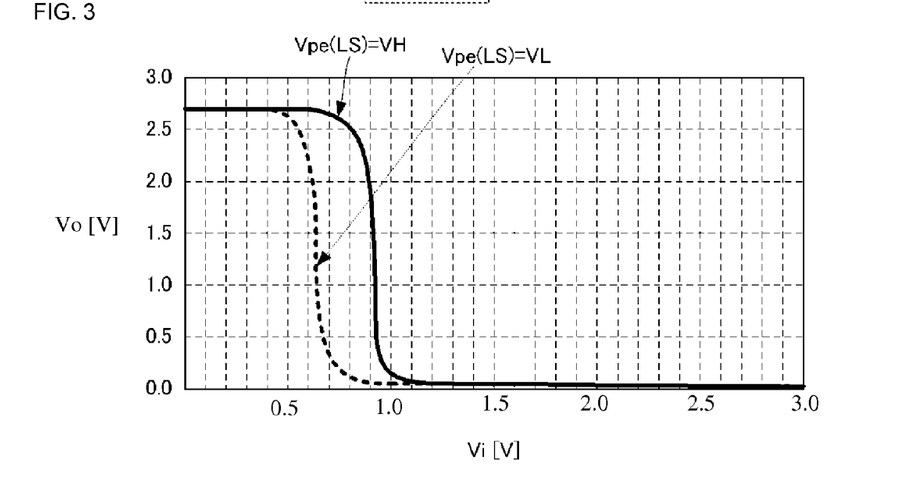
FIG. 3 illustrates the simulation results for a Vi-Vo characteristic of the level-conversion-function-equipped logic circuit 1 according to the first embodiment.

FIG. 3 illustrates the simulation results for a Vi-Vo characteristic of the level-conversion-function-equipped logic circuit 1 according to the first embodiment. In FIG. 3, the solid line illustrates a case in which the pinch off voltage Vpe(LS) of the EFET 101 of the logic circuit 100 is high (for example 0.4 V) and the broken line illustrates a case in which the pinch off voltage Vpe(LS) of the EFET 101 of the logic circuit 100 is low (for example, 0.1 V).

As is clear from FIG. 3, the difference in switching voltage Vch is small between the case in which the pinch off voltage Vpe(LS) is a low voltage VL (for example, 0.1 V) and the case where the pinch off voltage Vpe(LS) is a high voltage VH (for example, 0.4 V). For example, in the example of FIG. 3, the difference that was around 0.8 V in the related art has become as small as around 0.3 V.

Figure 4:
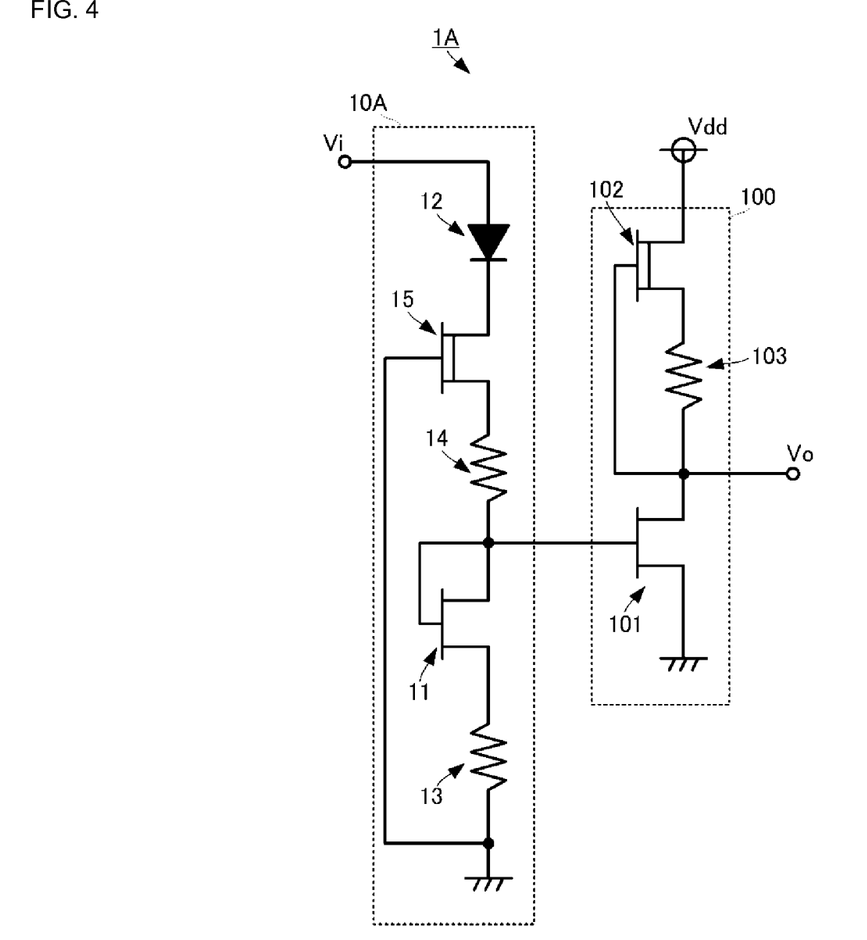
FIG. 4 is a circuit diagram of a level-conversion-function-equipped logic circuit 1A according to a second embodiment.

Next, a level-conversion-function-equipped logic circuit according to a second embodiment of the present invention will be described with reference to the drawings. FIG. 4 is a circuit diagram of a level-conversion-function-equipped logic circuit 1A according to the second embodiment. The configuration of a level conversion circuit 10A of the level-conversion-function-equipped logic circuit 1A of this embodiment is different from that of the first embodiment but the configuration of the logic circuit 100 is the same. Therefore, only the difference will be described.

The level conversion circuit 10A is obtained by connecting a DFET 15 between the diode 12 and the resistor 14 in the level conversion circuit 10 described in the first embodiment. The source of the DFET 15 is connected to the resistor 14 and the drain of the DFET 15 is connected to the cathode of the diode 12. The gate of the DFET 15 is grounded. In addition, the absolute value of a pinch off voltage of the DFET 15 is higher than the absolute value of the pinch off voltage of the EFET 11.

With this configuration, when the source voltage of the DFET 15 becomes equal to or higher than the absolute value of its pinch off voltage, current stops flowing in the level conversion circuit 10A. Thus, the DFET 15 functions as current restriction means. With this configuration, the size of the resistor 14 can be reduced while restricting the current to a predetermined value. In addition, if the DFET 15 is used, even though the same resistance is realized, it can be realized with a smaller area than with the resistor. Consequently, a level conversion circuit and a level-conversion-function-equipped logic circuit capable of restricting a current can be formed in a more compact size.

Figure 5:
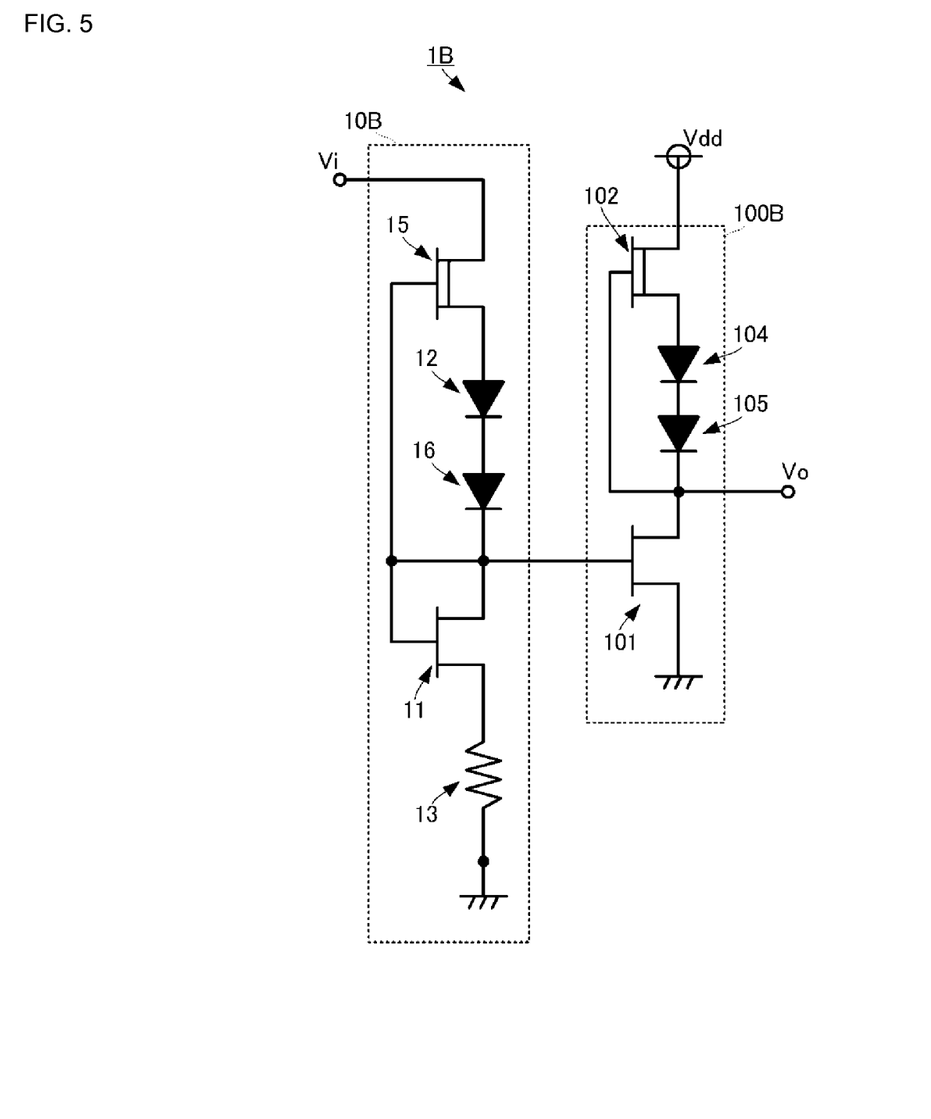
FIG. 5 is a circuit diagram of a level-conversion-function-equipped logic circuit 1B according to a third embodiment.

Next, a level-conversion-function-equipped logic circuit according to a third embodiment of the present invention will be described with reference to the drawings. FIG. 5 is a circuit diagram of a level-conversion-function-equipped logic circuit 1B according to the third embodiment.

The level-conversion-function-equipped logic circuit 1B of this embodiment includes a level conversion circuit 10B and a logic circuit 100B.

In the logic circuit 100B, the resistor 103 of the logic circuit 100 described in the first embodiment has been replaced with a series circuit formed of diodes 104 and 105. Describing this circuit configuration more concretely, the anode of the diode 104 is connected to the source of the DFET 102 and the cathode of the diode 104 is connected to the anode of the diode 105. The cathode of the diode 105 is connected to the drain of the EFET 101, the gate of the DFET 102 and the output terminal (output voltage Vo) of the logic circuit 100B. With this configuration, the diodes 104 and 105 function as "voltage maintenance means".

The configurations of the EFET 11 and the resistor 13 of the level conversion circuit 10B are the same as those of the level conversion circuit 10 described in the first embodiment. The drain and gate of the EFET 11 and the output terminal of the level conversion circuit 10B are connected to the cathode of a diode 16. The anode of the diode 16 is connected to the cathode of the diode 12. The anode of the diode 12 is connected to the source of the DFET 15.

The drain of the DFET 15 is connected to a control voltage input terminal (input voltage Vi). The gate of the DFET 15 is connected to the drain and the gate of the EFET 11, the cathode of the diode 16 and the output terminal of the level conversion circuit 10B. In addition, the absolute value of a pinch off voltage of the DFET 15 is higher than the absolute value of the pinch off voltage of the EFET 11.

With this configuration, the "voltage shifting means" is formed with the two stages of the diodes 12 and 16. In addition, the "current restriction means" is formed of just the DFET 15.

With this configuration, voltage maintenance means of the logic circuit 100B and current restriction means of the level conversion circuit 10B can be formed with semiconductor devices and therefore the level-conversion-function-equipped logic circuit 1B can be formed in a more compact size.

1, 1A, 1B, 1P: level-conversion-function-equipped logic circuit,
100, 100B: logic circuit,
10, 10A, 10B, 10P: level conversion circuit,
11, 11P, 101: EFET,
12, 12P, 16, 104, 105: diode,
13, 13P, 14, 103: resistor,
15P, 15, 102: DFET

The invention claimed is:

1. A level conversion circuit connected upstream of a logic circuit, the level conversion circuit comprising:
   a first enhancement type FET having a drain and a gate,
   a first resistor for voltage maintenance connected between a source of the first enhancement type FET and a ground, and
   voltage shifting means and current restriction means connected in series with each other between the drain and the gate of the first enhancement type FET and a control voltage input terminal, wherein
   the gate of the first enhancement type FET is connected to a gate of a second enhancement type FET and wherein the second enhancement type FET serves as an input FET of the logic circuit.

2. The level conversion circuit according to claim 1, wherein the voltage shifting means is a diode.

3. The level conversion circuit according to claim 1, wherein the current restriction means includes a second resistor.

4. The level conversion circuit according to claim 1, wherein the current restriction means includes a depletion type FET.

5. A level-conversion-function-equipped logic circuit comprising
   the level conversion circuit according to claim 1,
   a logic-circuit-side depletion type FET having a drain, a driving voltage being applied to the drain, and
   logic-circuit-side voltage maintenance means connected to a source of the logic-circuit-side depletion type FET,
   wherein a source of the input FET is grounded,
   a drain of the input FET is connected to a source of the logic-circuit-side depletion type FET via the logic-circuit-side voltage maintenance means, and
   a connection point between the drain of the input FET and the logic-circuit-side voltage maintenance means serves as an output terminal and is connected to a gate of the depletion type FET.

6. The level-conversion-function-equipped logic circuit according to claim 5, wherein the input FET of the logic circuit and the first enhancement FET of the level conversion circuit are formed on the same semiconductor substrate.

7. The level-conversion-function-equipped logic circuit according to claim 5, wherein the logic-circuit-side voltage maintenance means is composed of a diode.

8. The level conversion circuit according to claim 2, wherein the current restriction means includes a second resistor.

9. The level conversion circuit according to claim 2, wherein the current restriction means includes a depletion type FET.

10. The level conversion circuit according to claim 3, wherein the current restriction means includes a depletion type FET.

11. A level-conversion-function-equipped logic circuit comprising
    the level conversion circuit according to claim 2,
    a logic-circuit-side depletion type FET having a drain, a driving voltage being applied to the drain, and
    logic-circuit-side voltage maintenance means that is connected to a source of the logic-circuit-side depletion type FET,
    wherein a source of the input FET is grounded,
    a drain of the input FET is connected to a source of the logic-circuit-side depletion type FET via the logic-circuit-side voltage maintenance means, and
    a connection point between the drain of the input FET and the logic-circuit-side voltage maintenance means serves as an output terminal and is connected to a gate of the depletion type FET.

12. A level-conversion-function-equipped logic circuit comprising
    the level conversion circuit according to claim 3,
    a logic-circuit-side depletion type FET having a drain, a driving voltage being applied to the drain, and
    logic-circuit-side voltage maintenance means that is connected to a source of the logic-circuit-side depletion type FET,
    wherein a source of the input FET is grounded,
    a drain of the input FET is connected to a source of the logic-circuit-side depletion type FET via the logic-circuit-side voltage maintenance means, and
    a connection point between the drain of the input FET and the logic-circuit-side voltage maintenance means serves as an output terminal and is connected to a gate of the depletion type FET.

13. A level-conversion-function-equipped logic circuit comprising
    the level conversion circuit according to claim 4,
    a logic-circuit-side depletion type FET having a drain, a driving voltage being applied to the drain, and
    logic-circuit-side voltage maintenance means that is connected to a source of the logic-circuit-side depletion type FET,
    wherein a source of the input FET is grounded,
    a drain of the input FET is connected to a source of the logic-circuit-side depletion type FET via the logic-circuit-side voltage maintenance means, and
    a connection point between the drain of the input FET and the logic-circuit-side voltage maintenance means serves as an output terminal and is connected to a gate of the depletion type FET.

14. The level-conversion-function-equipped logic circuit according to claim 6, wherein the logic-circuit-side voltage maintenance means is composed of a diode.

* * * * *